United States Patent
Herre et al.

[11] Patent Number: 5,918,203
[45] Date of Patent: Jun. 29, 1999

[54] METHOD AND DEVICE FOR DETERMINING THE TONALITY OF AN AUDIO SIGNAL

[75] Inventors: Jürgen Herre, Buckenhof; Ernst Eberlein, Grossenseebach; Bernhard Grill, Lauf; Karlheinz Brandenburg, Erlangen; Heinz Gerhäuser, Waischenfeld, all of Germany

[73] Assignee: Fraunhofer-Gesellschaft Zur Förderung Der Angewandten Forschung E.V., Germany

[21] Appl. No.: 08/894,844

[22] PCT Filed: Feb. 9, 1996

[86] PCT No.: PCT/EP96/00550

§ 371 Date: Aug. 13, 1997

§ 102(e) Date: Aug. 13, 1997

[87] PCT Pub. No.: WO96/25649

PCT Pub. Date: Aug. 22, 1996

[30] Foreign Application Priority Data

Feb. 17, 1995 [DE] Germany .............. 195 05 435

[51] Int. Cl.⁶ .................................................. G10L 3/00
[52] U.S. Cl. .......................................... 704/205; 704/207
[58] Field of Search ................................ 704/207, 205, 704/230, 210, 215, 233, 236

[56] References Cited

U.S. PATENT DOCUMENTS

| | | | |
|---|---|---|---|
| 5,627,938 | 5/1997 | Johnston | 704/230 |
| 5,699,479 | 12/1997 | Allen et al. | 704/230 |
| 5,832,424 | 11/1998 | Tsutsui | 704/230 |
| 5,842,162 | 11/1998 | Fineberg | 704/233 |

FOREIGN PATENT DOCUMENTS 446037  11/1991  European Pat. Off. .

OTHER PUBLICATIONS

Funada, T. "A Method for the Extraction of Spectral Peaks and Its Application to Foundational Frequency Estimation of Speech Signals," *Signal Processing*, 13(1):15–28 (Jul. 1987)—Amsterdam, The Netherlands.

Hanna, S., "Frequency–Domain Maximum Likelihood Pitch Determination Approach," *Int. J. Electronics*, 73(6):1185–1199 (1992).

Armbrüster, W., et al., "Hands–Free Telephony, Speech Recognition and Speech Coding Techniques Implemented in the SPS51," *Phillips Telecommunication Review*, 49(1): 19–27 (Mar. 1991).

(List continued on next page.)

*Primary Examiner*—David R. Hudspeth
*Assistant Examiner*—Martin Lerner

[57] ABSTRACT

The tonality of an audio signal is determined by a method which includes the steps of blockwise frequency transforming a digital input signal x(n) to create a real positive-value representation X(k) of the input signal, where k designates the index of a frequency line, and determining the tonality T of the signal component for the frequency line k according to the following equation:

$$T(k) = \frac{F_1[X](k+d_1)}{F_2[X](k+d_2)}$$

where $F_1$ is the filter function of a first digital filter with a first, differentiating characteristic, $F_2$ is the filter function of a second digital filter with a second, flat or integrating characteristic or with a characteristic which is less strongly differentiating than the first characteristic, and $d_1$ and $d_2$ are integer constants which, depending on the filter parameters, are so chosen that the delays of the filters are compensated for in each case.

8 Claims, 1 Drawing Sheet

OTHER PUBLICATIONS

Indefrey, H. et al., "Design and Evaluation of Double–Transform Pitch Determination Algorithms with Nonlinear Distortion in the Frequency Domain—Preliminary Results," ICASSP 85 Proceedings of the IEEE International Conference on Acoustics, Speech, and Signal Processing, Mar. 26–29, 1985 (Tampa, FL).

Proakis, J., et al., *Digital Signal Processing—Principles, Algorithms, and Applications*, 2nd ed., Ch. 9 (pp. 684–707) and Ch. 10 (pp. 804–812), Macmillan Pub. Co., New York, NY (1992—earlier ed. 1988).

Hellman, R., "Asymmetry of Masking Between Noise and Tone," *Perception and Psychophysics*, 11(3):241–246 (1972).

Annex D entitled "Psychoacoustic Models," ISO/IEC 11172-3 (1993) (E)—[pp. 109–139].

Grigat, R., "Audio–und Videodaten–Kompression mit MPEG2," *Funkschau*, No. 3 (Jan. 20, 1995), pp. 26–33.

METHOD AND DEVICE FOR DETERMINING THE TONALITY OF AN AUDIO SIGNAL

FIELD OF THE INVENTION

The present invention refers to a method and a device for determining the tonality of an audio signal.

DESCRIPTION OF THE PRIOR ART

The basis for the hearing-adjusted coding and data reduction of audio signals is that the coding errors arising during coding are spectrally so shaped that they come to lie below the so-called masked hearing threshold and thus remain inaudible. As a result, the determination of the momentary masked hearing threshold during the coding of an audio signal or within a coder comes to play a crucial role.

The estimation of the masked hearing threshold is normally achieved using a hearing model which is designated "perceptual model". On the one hand the audio input signal is applied to this so-called "perceptual model" or hearing model and on the other hand, after a transformation by means of a filter bank or a frequency transformation performed on a block basis, it is applied to a quantizing/coding stage, which is accessed by the output signal of the hearing model or the perceptual model.

In this context the masking ability of a signal depends on whether the signal is a tone-like or tonal signal or is more a noisy or non-tonal signal, since noisy signals have a much stronger masking effect for coding errors than do tonal signal components. Concerning this, reference is made to R. P. Hellmann: "Asymmetry of Masking between Noise and Tone", Perception and Psychophysics, Vol. 11, pp. 241–246, 1972. For this reason, customary psychoacoustic models, such as the models described in the ISO/MPEG standard (cf. ISO/IEC 11172-3, Annex D), already contain mechanisms for detecting tonal signal components. For example, in the "psychoacoustic model 1" described there, a signal component is classified as "tonal" if its level is a certain factor (7 dB) greater than that of the surrounding frequency lines. In the "psychoacoustic model 2" a determination of the tonality is performed on the basis of a prediction of complex FFT indices, which exhibits only small prediction errors for tonal signals in the ideal case. From this the tonality of the signal components is inferred.

These two known methods permit only an unreliable detection of the tonality, however.

SUMMARY OF THE INVENTION

It is therefore a major object of the present invention to provide a method and a device for determining the tonality of an audio signal which exhibit increased reliability in the registration of the tonality of a signal.

According to a first aspect, the present invention provides a method for determining the tonality of an audio signal with the following steps: blockwise frequency transformation of a digital input signal x(n) to create a real positive-value representation X(k) of the input signal, where k designates the index of a frequency line, and determination of the tonality T of the signal components for the frequency line k according to the following equation:

$$T(k) = \frac{F_1[X](k+d_1)}{F_2[X](k+d_2)}$$

where $F_1$ is the filter function of a first digital filter with a first, differentiating characteristic, where $F_2$ is the filter function of a second digital filter with a second, flat or integrating characteristic or with a characteristic which is less strongly differentiating than the first characteristic, and where $d_1$ and $d_2$ are integer constants which, depending on the filter parameters, are so chosen that the delays of the filters are compensated for in each case.

According to a second aspect, the present invention provides a method for determining the tonality of an audio signal with the following steps: blockwise frequency transformation of an input signal x(n) to create a real positive-value representation X(k) of the input signal, where k designates the index of a frequency line, and determination of the tonality T of the signal components for the frequency line k according to the following equation:

$$T(k) = F[\log[X]](k+d),$$

where F is the filter function of a digital filter with a differentiating characteristic and where d is an integer constant which is so chosen that the delay of the filter is compensated for.

According to a third aspect, the present invention provides a device for determining the tonality of an audio signal with a transformation unit for the blockwise frequency transformation of a digital input signal x(n) to create a real positive-value representation X(k) of the input signal, where k designates the index of the frequency line, two digital filters with filter functions $F_1$, $F_2$, where $F_1$ is the filter function of the first digital filter with a first, differentiating characteristic and $F_2$ is the filter function of the second digital filter with a flat or integrating characteristic or with a characteristic which is less strongly differentiating than the first characteristic, and a unit for determining the tonality T of the signal components for the frequency line k according to the following equation:

$$T(k) = \frac{F_1[X](k+d_1)}{F_2[X](k+d_2)}$$

where $d_1$ and $d_2$ are integer constants which are so chosen that the delays of the filters are compensated for in each case.

According to a fourth aspect, the present invention provides a device for determining the tonality of an audio signal with a transform unit for the blockwise frequency transformation of a digital input signal x(n) to create a real positive-value representation X(k) of the input signal, where k designates the index of a frequency line, a digital filter with the filter function F, which is a differentiating characteristic, and a unit for determining the tonality T of the signal component for the frequency line k according to the following equation:

$$T(k) = F[\log[X]](k+d),$$

where d is an integer constant which, depending on the filter parameters of the filter F, is so chosen that the delay of the filter F is compensated for.

BRIEF DESCRIPTION OF THE DRAWINGS

Preferred embodiments of the method according to the present invention will be explained in more detail below making reference to the drawings, in which.

DESCRIPTION OF PREFERRED EMBODIMENTS OF THE INVENTION

Figure 1:
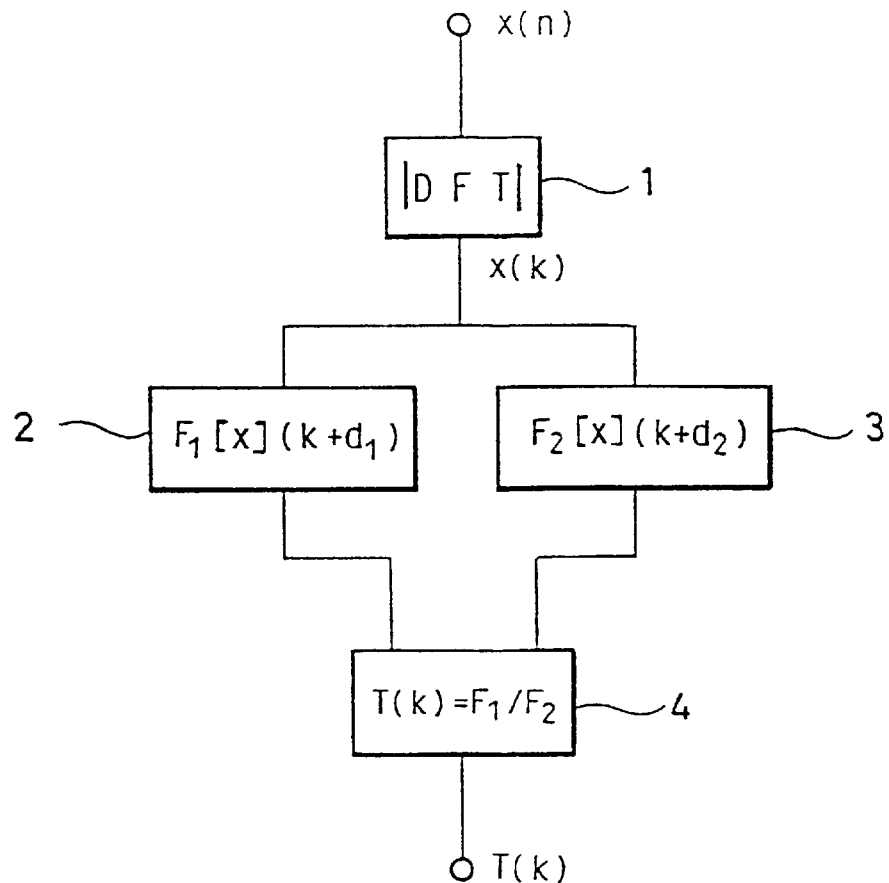
FIG. 1 shows a block diagram of a first embodiment of a device according to the present invention for determining the tonality of an audio signal.

As shown in FIG. 1, a digital input signal x(n) is first converted, on a block basis, into a real positive-value spectral absolute value representation X(k), where k is the index of the frequency line, said conversion being achieved by means of a frequency transform, which may be implemented e.g. by a computation device 1 for performing the discrete frequency transform and subsequent absolute value formation.

Apart from the absolute value formation of the amplitudes of the DFT spectrum, the absolute value representation may also be suitably achieved using the squares of the absolute values or another, energy conserving, transform.

Starting from this absolute value representation or energy representation of the discrete input signal in the frequency domain, the present invention envisages two computational concepts for determining the tonality T(k) of the signal component for the frequency line with the index k:

In the first embodiment, which will now be explained with reference to FIG. 1, the absolute value representation X(k) is applied to two digital filters 2, 3, where the first filter 2 has a filter function $F_1$ with differentiating characteristic. The second filter 3 has, in the preferred, simple case, a trivial filter function, i.e. an output value which is the same as the input value.

Through integer constants $d_1$, $d_2$ the delays of both filters are compensated for. As is known per se in the field of digital filter design, these constants depend on the chosen filter parameters.

A quotient formation circuit 4 combines the output values of the two digital filters 2, 3 through quotient formation, so that the complete computation device, starting with the spectral absolute value representation X(k), calculates the tonality T(k) of the kth signal line as follows:

$$T(k) = \frac{F_1[X](k + d_1)}{F_2[X](k + d_2)}$$

In the described preferred embodiment the filters employed are so-called FIR filters, i.e. so-called "finite impulse response" filters with symmetric pulse response. The first filter has, as already mentioned, a differentiating filter function $F_1$, i.e. it transmits high-frequency components preferentially.

The characteristic of the second-named filter 3 can, in addition to the trivial characteristic ($F_2[X]=1$) considered as preferred, also be a summing or integrating characteristic. What is essential is that the characteristic of the first filter 2 should be more strongly differentiating than that of the second filter 3.

Figure 2:
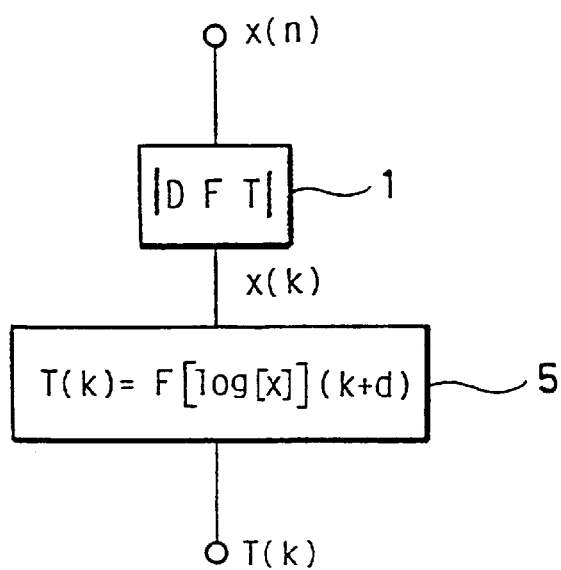
FIG. 2 shows a block diagram of a second embodiment of a device for determining the tonality of an audio signal.

Other than in the embodiment described with reference to FIG. 1, the tonality value T(k) can also be determined by means of the additional embodiment of the device for determining the tonality of an audio signal shown in FIG. 2.

Block 1 of this device is the same as block 1 of the device in FIG. 1 and forms the spectral absolute value representation X(k) through blockwise discrete Fourier transform of the input signal x(n).

A computation device 5 for determining the tonality T(k) of the kth signal component determines the tonality on the basis of the following relationship:

$$T(k)=F[\log[X]](k+d).$$

Here, too, the constant d indicates an integer value for compensating the delay of the filter, which also depends here on the chosen filter parameters. The preferred embodiment for the digital filter is also here an FIR filter with symmetrical pulse response. The filter F exhibits a differentiating characteristic, i.e. it transmits high-frequency components preferentially.

For the person skilled in the art it is apparent that the tonality values T(k) achieved by the method and devices according to the present invention are raw values, which can be adapted to whichever psychoacoustic model is being used by means of a suitable non-linear adaptation function, even if this is not regarded as essential. The direct use of these tonality values to determine the masking effect of the input signal is also possible.

We claim:

1. A method for determining the tonality of an audio signal, comprising the steps of:

blockwise frequency transforming of a digital input signal x(n) to create a real positive-value representation X(k) of the input signal, where k designates the index of a frequency line, and determining the tonality T of the signal component for the frequency line k according to the following equation:

$$T(k) = \frac{F_1[X](k + d_1)}{F_2[X](k + d_2)}$$

where $F_1$ is the filter function of a first digital filter with a first, differentiating characteristic, where $F_2$ is the filter function of a second digital filter with a second, flat or integrating characteristic or with a characteristic which is less strongly differentiating than the first characteristic, and where $d_1$ and $d_2$ are integer constants which, depending on the filter parameters, are so chosen that the delays of the filters are compensated for in each case.

2. A method for determining the tonality of an audio signal, comprising the steps of:

blockwise frequency transforming of a digital input signal x(n) to create a real positive-value representation X(k) of the input signal, where k designates the index of a frequency line, and determining the tonality T of the signal components for the frequency line k according to the following equation:

$$T(k)=F[\log[X]](k+d),$$

where F is the filter function of a digital filter with differentiating characteristic, and where d is an integer constant which is so chosen that the delay of the filter is compensated for.

3. The method according to claim 1 or 2, wherein in the step of blockwise frequency transforming, a real absolute value representation X(k) of the input signal is formed.

4. A device for determining the tonality of an audio signal, comprising:

a transform unit for the blockwise frequency transformation of a digital input signal x(n) to create a real positive-value representation X(k) of the input signal, where k designates the index of the frequency line, two digital filters with filter functions $F_1$, $F_2$, where $F_1$ is the filter function of the first digital filter with a first, differentiating characteristic and $F_2$ is the filter function of the second digital filter with a flat or integrating characteristic or with a characteristic which is less strongly differentiating than the first characteristic, and a unit for determining the tonality T of the signal component for the frequency line k according to the following equation:

$$T(k) = \frac{F_1[X](k+d_1)}{F_2[X](k+d_2)}$$

where $d_1$ and $d_2$ are integer constants which are so chosen that the delays of the filters are compensated for in each case.

5. A device for determining the tonality of an audio signal, comprising:

a transform unit for the blockwise frequency transformation of a digital input signal x(n) to create a real positive-value representation X(k) of the input signal, where k designates the index of a frequency line, a digital filter with the filter function F, which has a differentiating characteristic, and a unit for determining the tonality T of the signal component for the frequency line k according to the following equation:

$$T(k) = F[\log[X]](k+d),$$

where d is an integer constant which, depending on the filter parameters of the filter F, is so chosen that the delay of the filter F is compensated for.

6. The device according to claim 4 or 5, wherein the transform unit forms the real absolute value representation X(k) of the frequency transformed value of the digital input signal.

7. The device according to claim 4, wherein the first and second digital filters are implemented as FIR filters.

8. The device according to claim 5, wherein the filter F is implemented as a FIR filter.

* * * * *